United States Patent
Hazucha et al.

(10) Patent No.: US 6,798,248 B2
(45) Date of Patent: Sep. 28, 2004

(54) NON-OVERLAPPING CLOCK GENERATION

(75) Inventors: Peter Hazucha, Beaverton, OR (US); Tanay Karnik, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 10/326,731

(22) Filed: Dec. 20, 2002

(65) Prior Publication Data

US 2004/0119500 A1 Jun. 24, 2004

(51) Int. Cl.[7] .............................................. H03K 19/00
(52) U.S. Cl. ........................... 326/93; 326/96; 327/239; 327/259; 327/295
(58) Field of Search ............................. 326/93, 96, 239, 326/251, 259, 295; 327/239, 259, 295, 251; 331/57

(56) References Cited

U.S. PATENT DOCUMENTS

| | | | | | |
|---|---|---|---|---|---|
| 4,236,121 A | * | 11/1980 | Senturia | ........................ | 331/57 |
| 4,417,158 A | * | 11/1983 | Ito et al. | ....................... | 327/295 |
| 4,560,954 A | * | 12/1985 | Leach | ..................... | 331/108 B |
| 5,086,236 A | * | 2/1992 | Feemster | ..................... | 327/144 |
| 5,357,217 A | * | 10/1994 | Marchesi et al. | .............. | 331/57 |
| 5,444,405 A | * | 8/1995 | Truong et al. | ............... | 327/239 |
| 5,818,276 A | * | 10/1998 | Garrity et al. | ............... | 327/259 |

* cited by examiner

*Primary Examiner*—Michael Tokar
*Assistant Examiner*—Khai M. Nguyen
(74) *Attorney, Agent, or Firm*—Buckley, Maschoff & Talwalkar LLC

(57) ABSTRACT

According to some embodiments, non-overlapping clocks are to be generated.

18 Claims, 12 Drawing Sheets

NON-OVERLAPPING CLOCK GENERATION

BACKGROUND

Multiple clock signals can coordinate the operation of circuit elements in a microprocessor. For example, two out of phase clock signals can coordinate the operation of a shift register or scan chain circuit. Moreover, the clock signals may be generated in a "non-overlapping" fashion to prevent data race-through in the circuit (e.g., two successive latches will not pass data at the same time). That is, the clock signals may be generated such that both clocks signals are not active at the same time.

As another example, two out of phase clock signals can be provided to a simple switched-mode Direct Current (DC) to DC converter (e.g., a buck converter or a switched capacitor converter). In this case, an inductor or a capacitor accumulates energy from an input power supply during one phase, and the accumulated energy is transferred to the output of the converter during another phase. Once again the clock signals may be generated in a non-overlapping fashion, because an accidental overlap of the two phases might short circuit the input power supply (e.g., wasting power and perhaps damaging devices in the circuit).

FIG. 1 illustrates a known circuit 100 that can generate two-phase, non-overlapping clock signals (i.e., CLKA and CLKB). An input clock signal (i.e., CLKIN) is provided to a first NAND gate 110 and an inverted CLKIN is provided to a second NAND gate 120 (e.g., after CLKIN passes through an inverter 150). The output of the first NAND gate 110 is coupled to a non-inverting delay element 130 that introduces a delay of T. The output of the delay element 130 is coupled to both an input of the second NAND gate 120 and an inverter 140 that provides CLKA. Similarly, the output of the second NAND gate 120 is coupled to another delay element 130, which in turn is coupled to both an input of the first NAND gate 110 and an inverter 140 that provides CLKB.

As can be seen by the clock waveforms illustrated in FIG. 1, the two clock signals generated by the circuit 100 are out of phase. Moreover, to ensure that CLKA and CLKB are non-overlapping (e.g., that no accidental overlap occurs because of skew, jitter, or degraded rise and fall times in a clock signal), a dead time is provided. Thus, there are periods of time when both CLKA and CLKB are not active (the cross-hatched areas).

One disadvantage to this approach is that the operation of the circuit 100 is dependent on an externally generated clock signal (i.e., CLKIN). The creation of this externally generated clock signal will require additional devices, such as a Voltage-Controlled Oscillator.

In some situations, multiple pairs of two-phase, non-overlapping clock signals are desired. For example, a distributed DC-DC converter may be used in a high-current application (e.g., microprocessor power delivery). In this case, a number of simple converters will each receive a pair of two-phase, non-overlapping clock signals—and the pair of clock signals received by each converter will be shifted in phase as compared to the other converters.

FIG. 2 illustrates a known circuit 200 that generates three two-phase, non-overlapping clock signal pairs. Here, CLKIN propagates through a delay line having a number of non-inverting delay elements 210. In this way, three offset versions of CLKIN are generated. Each version of CLKIN is provided to an independent circuit 100 that generates a single pair of two-phase, non-overlapping clock signals (i.e., CLK1A and CLK1B, CLK2A and CLK2B, or CLK3A and CLK3B). Note that each independent circuit 100 may operate as described with respect to FIG. 1. The three pairs of non-overlapping clock signals can then be provided to a distributed DC-DC converter.

Note that the operation of the circuit 200 is dependent on an externally generated clock signal (i.e., CLKIN). As another approach, the delay line could be a sub-circuit of a ring oscillator, VCO, Delay-Locked Loop (DLL), or Phase-Locked Loop (PLL) that generates the clock signals to be provided to each circuit 100. In that case, CLKIN would not be required unless there is a need for synchronization of the generated clocks to some external clock signal.

Another disadvantage is that a separate circuit 100 is needed to generate each pair of non-overlapping clock signals. Such an approach may require a large number of circuit elements, consume a significant amount of power, and/or occupy a large area in a microprocessor die.

DETAILED DESCRIPTION

In the following description, particular types of integrated circuits, circuit configurations, logic blocks, and signals are described for purpose of illustration. It will be appreciated, however, that other embodiments are applicable to other types of integrated circuits, circuit configurations, logic blocks, and signals. Moreover, as used herein a clock signal is active when high and inactive when low. According to other embodiments, however, a clock signal may instead be active when low and inactive when high.

Two-Phase, Non-Overlapping Clock Signal Generator

Figure 3:
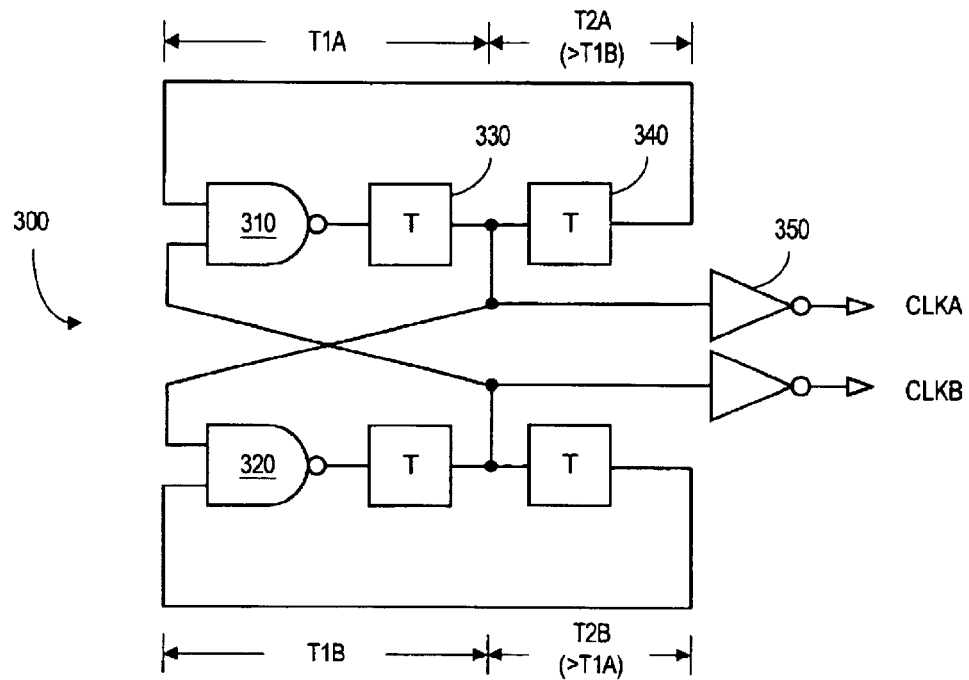
FIG. 3 is a circuit to generate two-phase, non-overlapping clock signals according to some embodiments.
Figure 3:
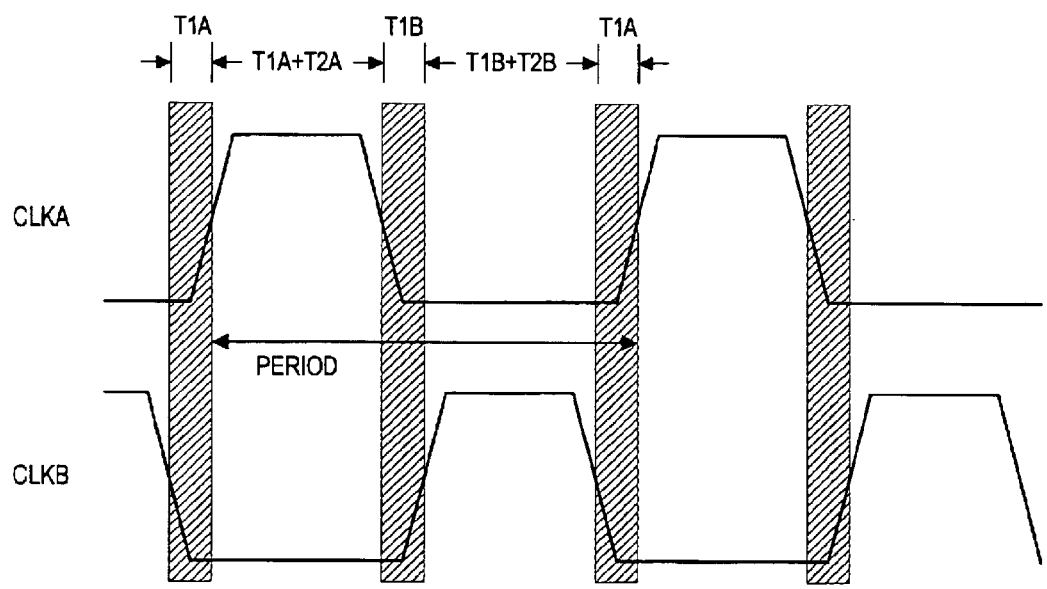

FIG. 3 is a circuit 300 to generate two-phase, non-overlapping clock signals (i.e., CLKA and CLKB) according to some embodiments. The circuit 300 includes a first logic gate 310 that has two input lines and an output line. By way of example, NAND gates are used to illustrate logic gates in the circuits described herein.

The output of the first NAND gate 310 is coupled to a first delay path that includes two delay elements 330, 340. The end of the first delay path is coupled to an input of the first NAND gate 310. A point or "node" between the two delay elements 330, 340 is associated with CLKA (i.e., after being inverted by an inverter 350) and is also coupled to an input of a second NAND gate 320.

Similarly, the output of the second NAND gate 320 is coupled to a second delay path that includes two delay elements. The end of the second delay path is coupled to the other input of the second NAND gate 320. A node between the two delay elements is associated with CLKB (i.e., after being inverted by an inverter) and is also coupled to the other input of the first NAND gate 310.

The delay elements in FIG. 3 may comprise, for example, non-inverting delay elements that introduce a delay of T. Note that different delay elements might introduce different delays. Moreover, each delay element might be associated with either a fixed delay or a variable delay.

Figure 4:
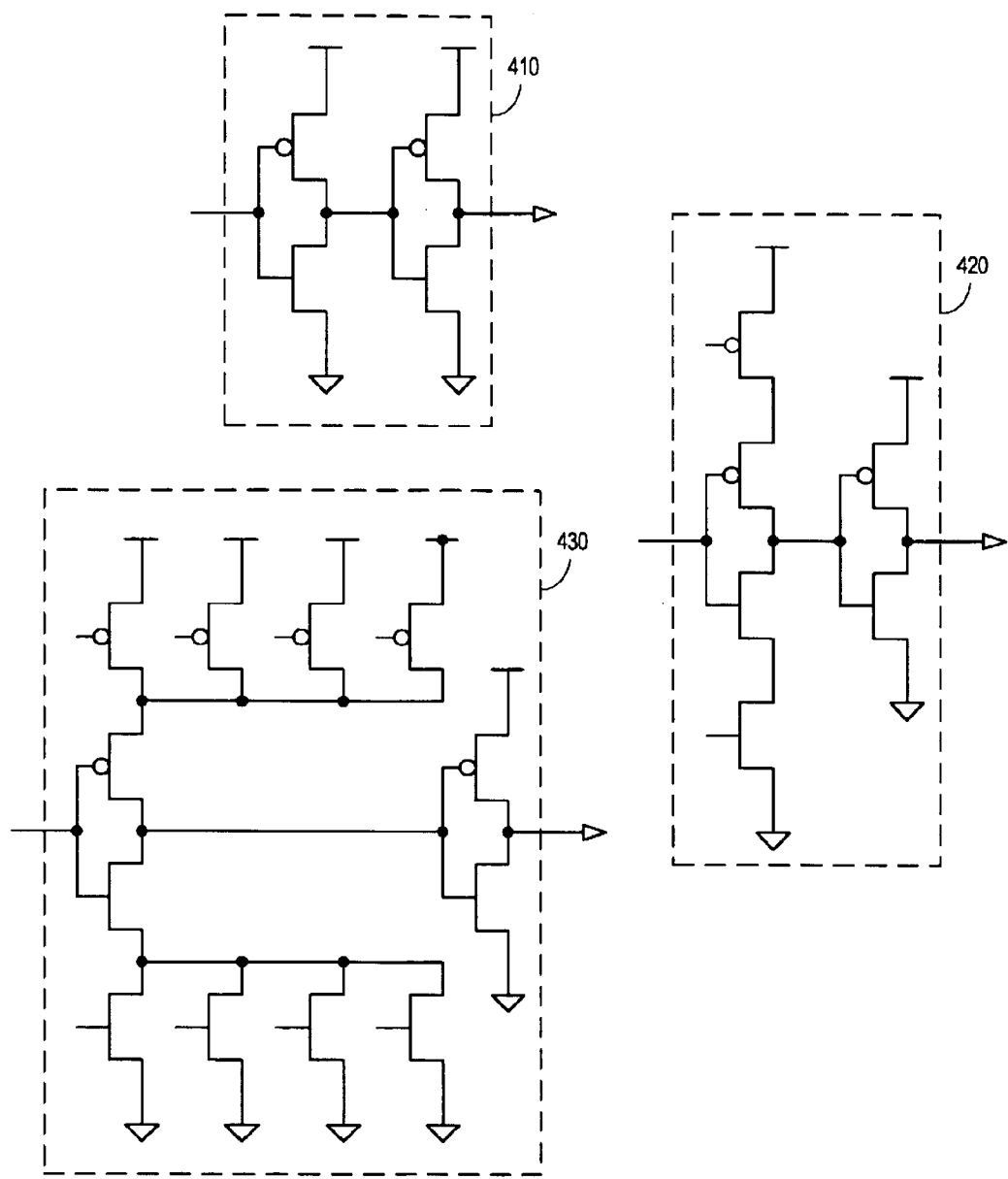
FIG. 4 illustrates delay elements according to some embodiments.

For example, FIG. 4 illustrates three delay elements that may be associated with any of the embodiments described herein. In particular, a first delay element 410 comprises an even number of Complementary Metal Oxide Semiconductor (CMOS) inverters to introduce a fixed delay at a given supply voltage. A second delay element 420 comprises an analog current-starved inverter such that the amount of delay can be continuously adjusted by biasing the stacked devices. A third delay element 430 comprises a digital current-starved inverter such that discrete values of delay can be introduced by varying the amount of conducting devices in the stack.

Referring again to FIG. 3, the delay associated with the first NAND gate 310 and the first delay element 330 in the first delay path is T1A (i.e., T1A represents an amount of time a signal takes to propagate from an input of the first NAND gate 310 to the node associated with CLKA), and the delay associated with the second delay element 340 in the first delay path is T2A. Moreover, the delay associated with the second NAND gate 320 and the second delay element in the first delay path is T1B, and the delay associated with the second delay element in the second delay path is T2B. According to some embodiments, T2A is greater than T1B and T2B is greater than T1A.

As a result of the configuration of the circuit 300, feedback is introduced to make the circuit 300 oscillate. Moreover, the node associated with CLKA and the node associated with CLKB are synchronization nodes where the dead time between the phases and the active time of each phase is defined. In particular, T1A and T1B determine the amount of dead time between the two active phases. In addition, the active time of phase CLKA can be adjusted by delay T2A and the active time of phase CLKB can be adjusted by delay T2B.

Consider the clock signals illustrated in FIG. 3. As can be seen, both CLKA and CLKB are inactive for T1A. CLKA then transitions to active and CLKB remains inactive for T1A+T2A. Both CLKA and CLKB are then inactive again for T1B. CLKB then transitions to active and CLKA remains inactive for T1B+T2B. This pattern is repeated for subsequent clock cycles. As a result, the total clock period for CLKA and CLKB is 2*T1A+2*T1B+T2A+T2B. Note that the circuit 300 may generate the two-phase, non-overlapping clock signals without requiring an externally generated clock signal.

According to some embodiments, the delay of the first delay path does not equal the delay of the second delay path to facilitate safe oscillation at start-up. For example, a small mismatch (e.g., 5% to 10%) between (T1A+T2A) and (T1B+T2B) may be provided.

Figure 5:
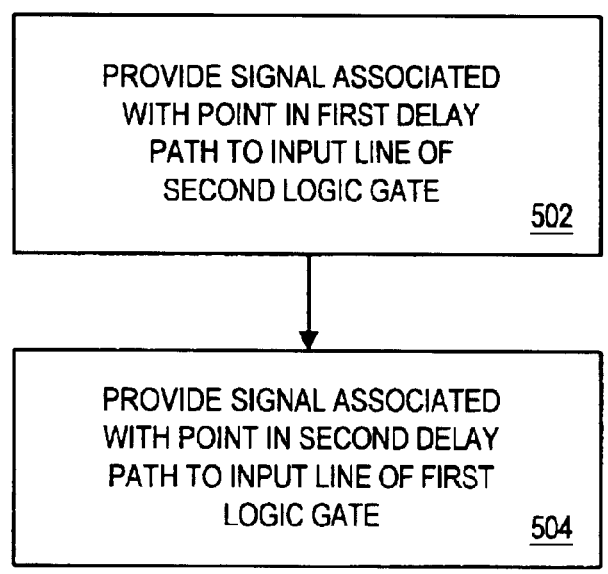
FIG. 5 is a flow chart of a method according to some embodiments.

FIG. 5 is a flow chart of a method according to some embodiments. The method may be associated with, for example, the apparatus 300 of FIG. 3. The flow chart described herein does not necessarily imply a fixed order to the actions, and embodiments may be performed in any order that is practicable.

At 502, a signal associated with a first node in a first delay path is provided to an input line of a second logic gate (e.g., a NAND gate). At 504, a signal associated with a second node in a second delay path is provided to an input line of a first logic gate. Moreover, the first delay path may be coupled between an output line of the first logic gate and another input line of the first logic gate. Similarly, the second delay path may be coupled between an output line of the second logic gate and another input line of the second logic gate. Note that the first node may be associated with a first clock signal and the second node may be associated with a second clock signal.

Figure 6:
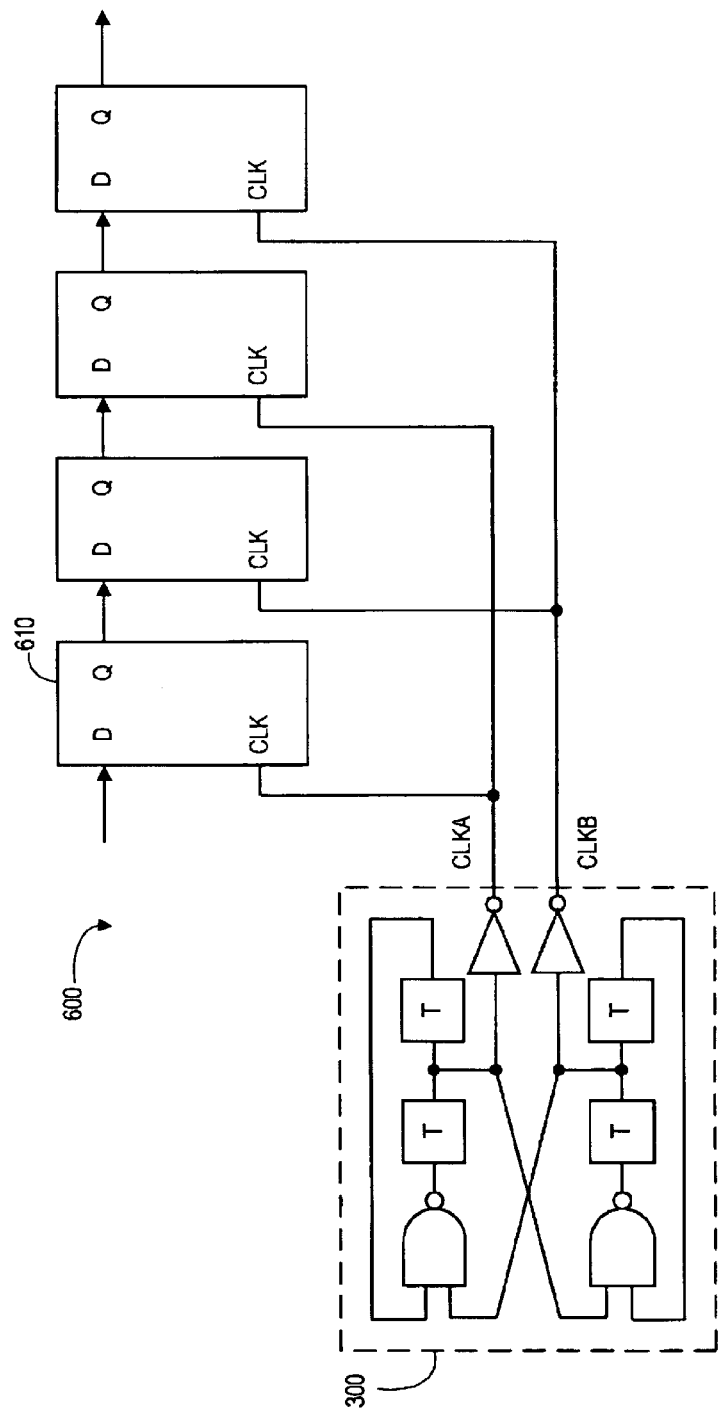
FIG. 6 is a circuit that provides two-phase, non-overlapping clock signals to a series of latches according to some embodiments.
Figure 7:
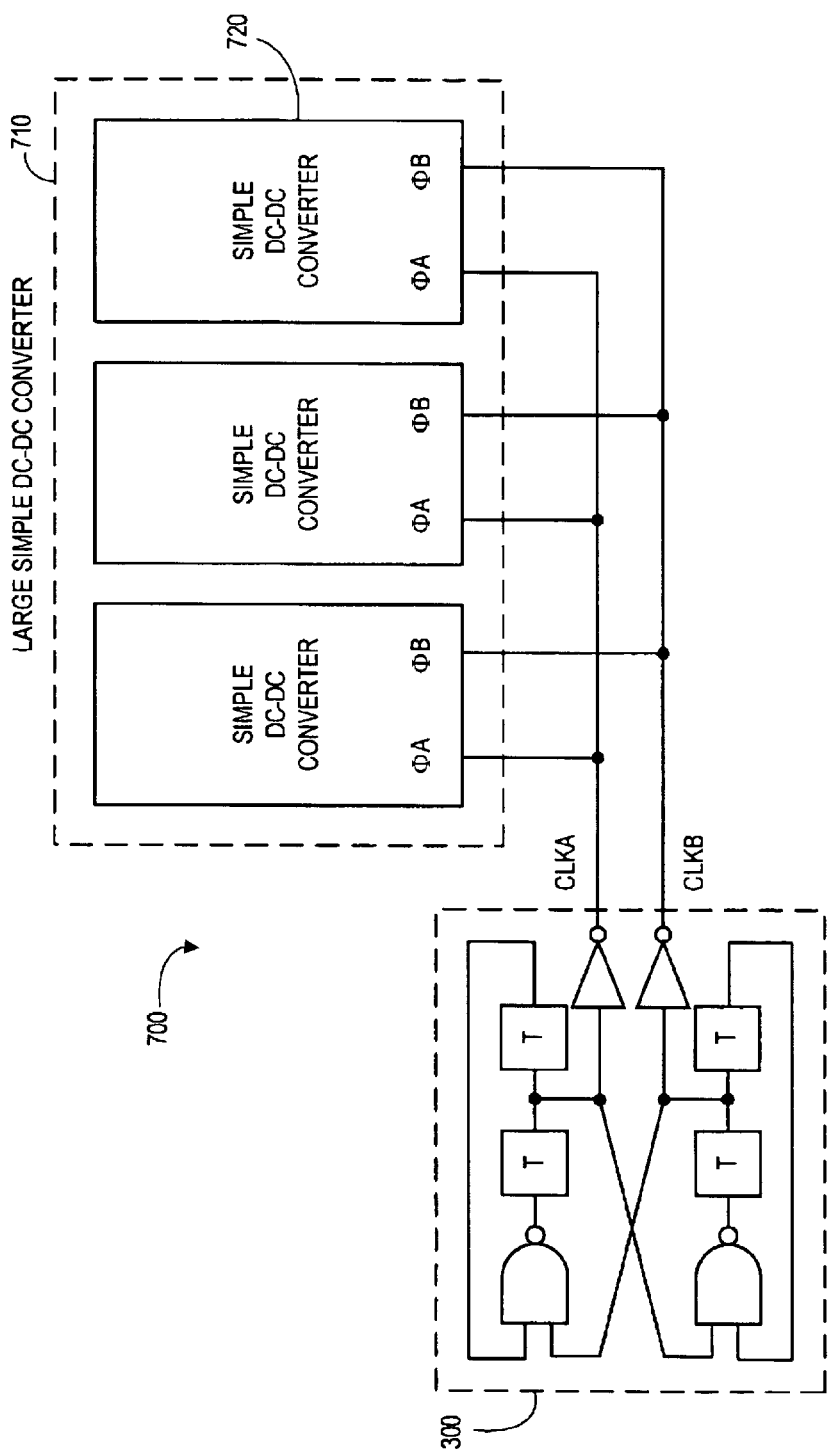
FIG. 7 is a circuit that provides two-phase, non-overlapping clock signals to a large simple DC-DC converter according to some embodiments.

Examples according to some embodiments will now be provided with respect to FIGS. 6 and 7.

EXAMPLES

FIG. 6 is a circuit 600 that provides two-phase, non-overlapping clock signals (i.e., CLKA and CLKB) to a series of latches 610 according to some embodiments. The latches 610 may be associated with, for example, a shift register or scan chain circuit. According to this embodiment, two master latches 610 are clocked using CLKA and two slave latches 610 are clocked using CLKB. Moreover, CLKA and CLKB are generated by the circuit 300 as described with respect to FIG. 3. Because CLKA and CLKB are generated in a non-overlapping fashion, data race-through in the circuit 600 may be avoided (e.g., two successive latches 610 will not pass data at the same time).

As another example, FIG. 7 is a circuit 700 that provides two-phase, non-overlapping clock signals (i.e., CLKA and CLKB) to a large simple DC-DC converter 710 according to some embodiments. The large simple DC-DC converter 710 includes three simple DC-DC converters 720 (e.g., buck converters or a switched capacitor converters) that each receive CLKA as phase A ("ΦA") and CLKB as phase B ("ΦB"). Each simple DC-DC converter 720 accumulates energy from an input power supply during ΦA, and the accumulated energy is transferred to the output of the converter during ΦB. Moreover, CLKA and CLKB are generated by the circuit 300 as described with respect to FIG. 3. Because CLKA and CLKB are generated in a non-overlapping fashion, a short circuit condition in the circuit 700 may be avoided.

Multiple Two-Phase, Non-Overlapping Clock Signal Pair Generator

Figure 8:
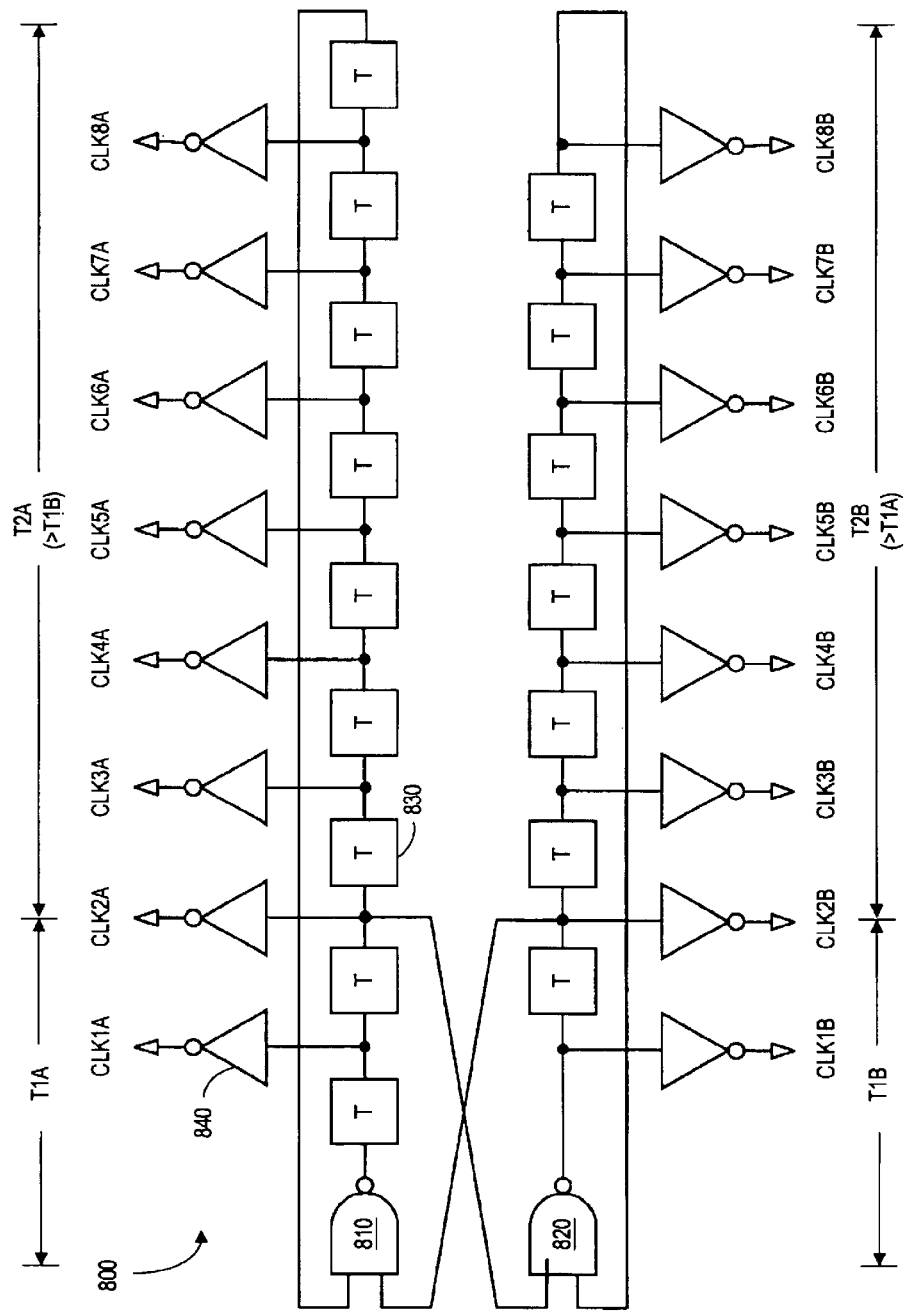
FIGS. 8 and 9 are circuits that generate multiple two-phase, non-overlapping phase-shifted clock signal pairs according to some embodiments.
Figure 9:
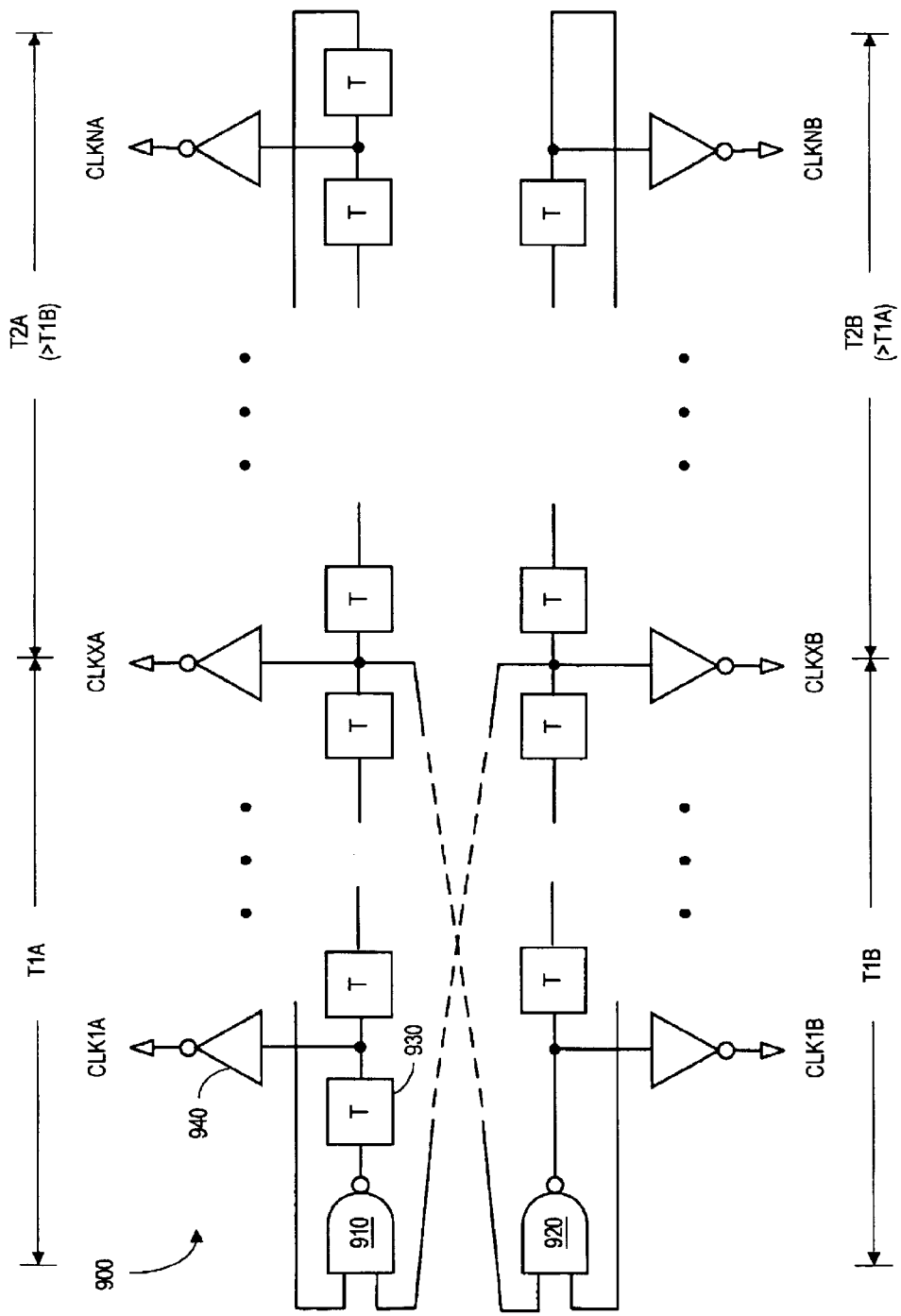

FIGS. 8 and 9 are circuits that generate multiple two-phase, non-overlapping phase-shifted clock signal pairs according to some embodiments. Referring now to FIG. 8, the circuit 800 includes a first NAND gate 810 that has two input lines and an output line.

The output of the first NAND gate 810 is coupled to a first delay path that includes nine delay elements 830. The end of the first delay path is coupled to an input of the first NAND gate 810. A node within the first delay path is coupled to an input of a second NAND gate 820.

Similarly, the output of the second NAND gate 820 is coupled to a second delay path that includes seven delay elements. The end of the second delay path is coupled to the other input of the second NAND gate 820. A node within the second delay path is coupled to the other input of the first NAND gate 810.

Sixteen inverters 840 coupled to nodes along the first and second delay paths (i.e., between delay elements 830) provide eight two-phase, non-overlapping clock signal pairs (i.e., CLK1A and CLK1B through CLK8A and CLK8B). That is, the eight clock pairs can be generated simultaneously by tapping clocks after delay elements 830. Moreover, by selecting appropriate delay values for the delay elements 830, the rising edges of the eight clock signals CLK1A through CLK8A may be uniformly distributed over the first portion of the clock cycle time, and the rising edges of the eight clock signals CLK1B through CLK8B may be uniformly distributed over the second portion of the clock cycle time. The first portion of the clock cycle time may be substantially equal to T1A+T2A, and the second portion of the clock cycle time may be substantially equal to T1B+T2B.

As a result of the configuration of the circuit 800, feedback is introduced to make the circuit 800 oscillate. Moreover, the node associated with CLK2A and the node associated with CLK2B comprise synchronization nodes where the dead time between the phases and the active time of each phase is defined. In particular, T1A (i.e., the delay between the input of the first NAND gate 810 and the node associated with CLK2A) and T1B (i.e., the delay between the node associated with CLK2A and the input of the first NAND gate 810) determine the amount of dead time between the two active phases. In order to maintain same dead times for phases A and B of all clocks, corresponding delays with respect to the nodes associated with CLK2A and CLK2B may be matched. Moreover, the first and last delay elements in the first delay path may be inserted to adjust the dead times or active times. These delays may also introduce a relatively small mismatch between the total delays (T1A+T2A) and (T1B+T2B) to facilitate oscillation start-up.

Figure 1:
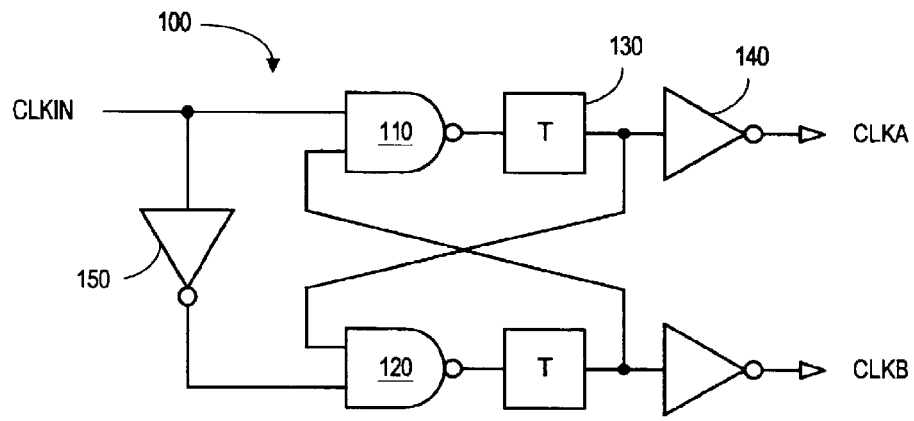
FIG. 1 illustrates a known circuit that generates two-phase, non-overlapping clock signals.
Figure 1:
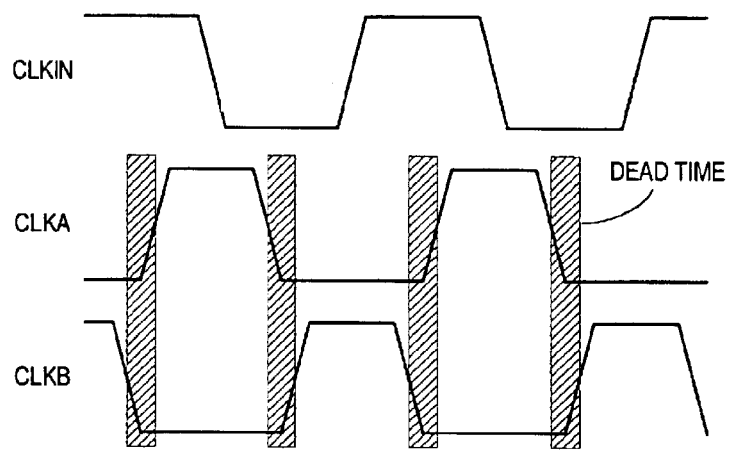
Figure 2:
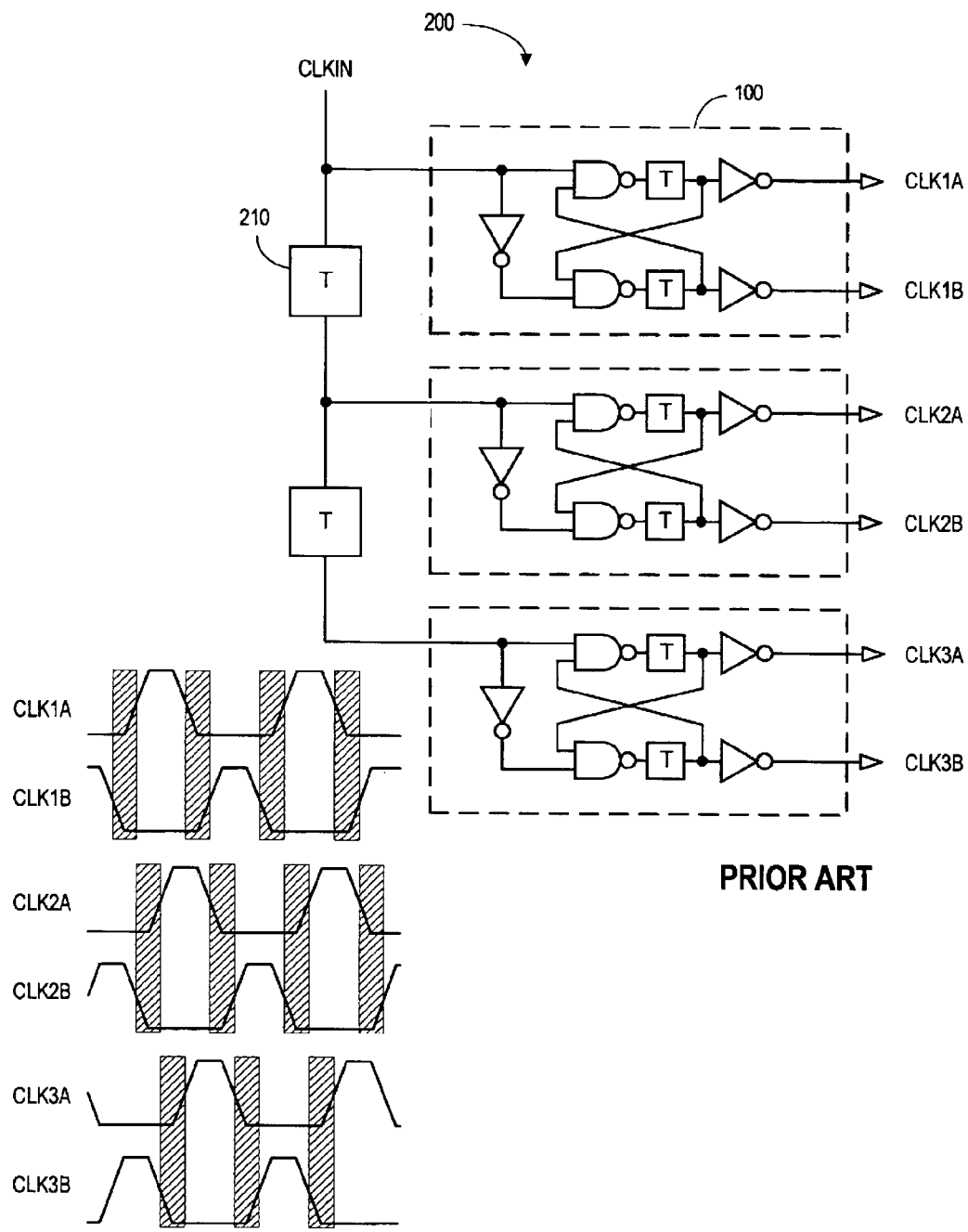
FIG. 2 illustrates a known circuit that generates three two-phase, non-overlapping clock signal pairs.

Note that a separate circuit 800 is not required to generate each pair of non-overlapping clock signals. As a result, this approach may reduce the number of circuit elements, the amount of power consumed, and/or the area occupied in a microprocessor die as compared to a traditional circuit (e.g, as described with respect to FIG. 2).

According to some embodiments, the invertors 840 are replaced with NAND gates. The NAND gates may then be used to dynamically adjust the number of active and idle clocks. In this case, conversion efficiency may be improved at low load (e.g., by reducing the number of active clocks and active DC-DC converter modules).

Although the circuit 800 illustrated in FIG. 8 generates eight two-phase, non-overlapping clock signal pairs, fewer clock signal pairs could be generated instead (e.g., by removing some of the delay elements 830 and associated inverters 840). Similarly, more clock signal pairs could be generated (e.g. by inserting additional delay elements 830 and associated inverters 840). For example, FIG. 9 illustrates a circuit 900 that includes two NAND gates 910, 920, a number of delay elements 930, and a number of inverters 940 to generate N two-phase, non-overlapping clock signal pairs according to some embodiments. The circuit 900 may be used to generate any appropriate number of clock signal pairs.

Figure 10:
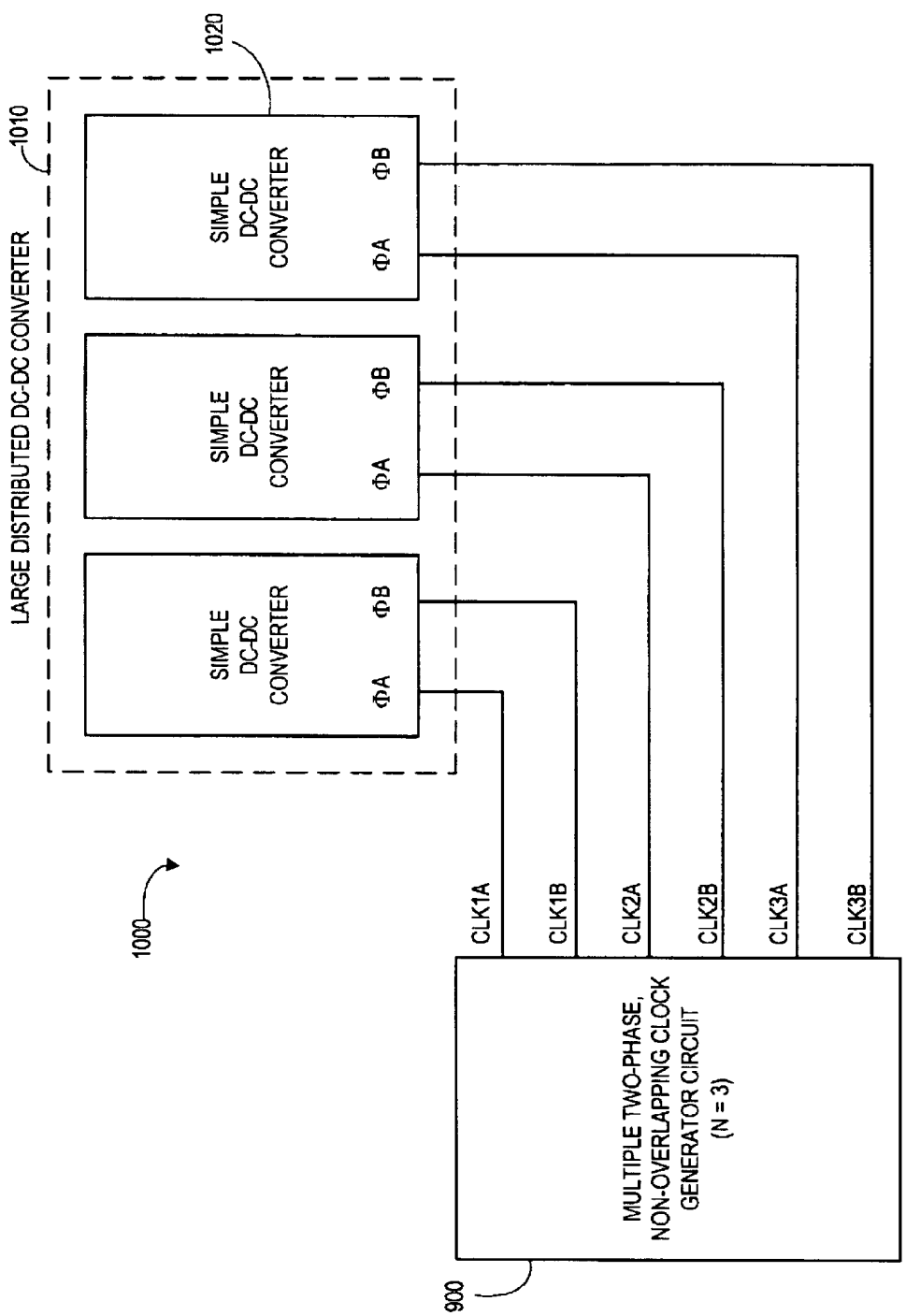
FIG. 10 is a circuit that provides three two-phase, non-overlapping clock signal pairs to a large distributed DC-DC converter according to some embodiments.

By way of example, FIG. 10 is a circuit 1000 that provides three two-phase, non-overlapping clock signal pairs (i.e., CLKxA and CLKxB where x equals 1, 2, or 3) to a large distributed DC-DC converter 1010 according to some embodiments. Such a circuit 1000 might be associated with, for example, on-die generation of a secondary supply voltage for a microprocessor or high-to-low main microprocessor supply voltage conversion.

The large distributed DC-DC converter 1010 includes three simple DC-DC converters 1020 that each receive CLKxA as phase A ("ΦA") and CLKxB as phase B ("ΦB"). Each simple DC-DC converter 1020 accumulates energy from an input power supply during ΦA, and the accumulated energy is transferred to the output of the converter during ΦB. Moreover, CLKxA and CLKxB are generated by a two-phase, non-overlapping clock generator circuit 900 as described with respect to FIG. 9 (i.e., with N equal to 3). Because CLKxA and CLKxB are generated in a non-overlapping fashion, a short circuit condition in the circuit 1000 may be avoided. Moreover, because each simple DC-DC converter 1020 switches at different times and the phases are staggered, less high-frequency noise may be generated as compared to the circuit described with respect to FIG. 7.

Figure 11:
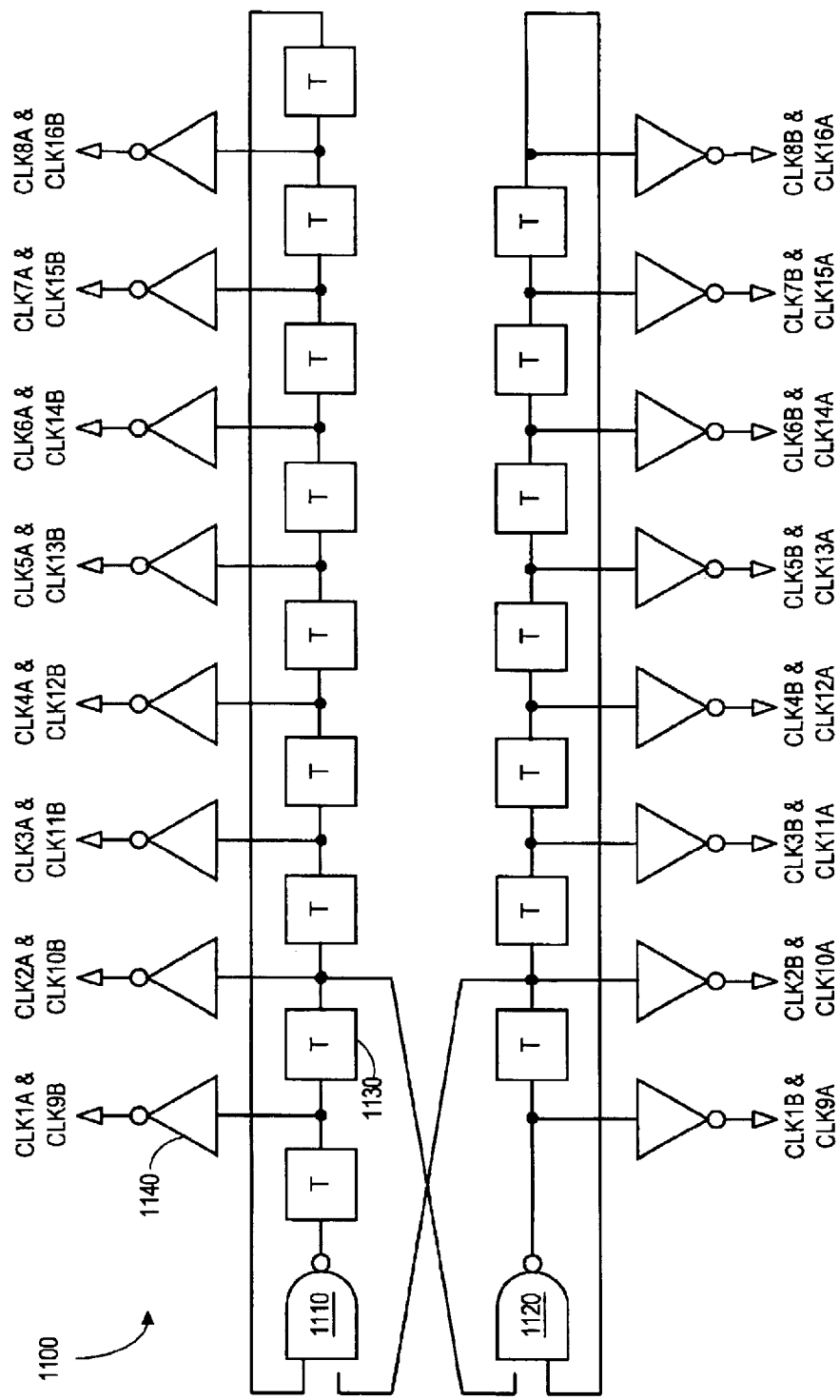
FIG. 11 is a circuit to generate sixteen two-phase, non-overlapping clock signal pairs according to another embodiment.

The circuit 800 of FIG. 8 was described as generating eight clock signal pairs, and the rising edges of CLK1A through CLK8A were distributed over the first portion of the clock cycle time. Similarly, the circuit 900 in FIG. 9 was described as generating N clock signal pairs, and the rising edges of CLK1A through CLKNA were distributed over the first portion of clock cycle time. Additional clocks might be obtained by swapping the clock phases A and B. For example, FIG. 11 is a circuit 1100 that generates sixteen two-phase, non-overlapping clock signal pairs (i.e., CLKxA and CLKxB where x equals from 1 to 16) according to another embodiment. By selecting appropriate delay values for the delay elements 1130, the rising edges of clock signals CLK1A through CLK16A may be uniformly distributed over the full clock cycle time, and at the same time the rising edges of CLK1B and CLK16B may be uniformly distributed over the full clock cycle time. Such a circuit might be appropriate, for example, when the original number of clock signals was small (e.g., ten clock signals). Operating DC-DC converters off clock signal pairs that are uniformly distributed over the full clock cycle time may generate less high frequency noise as compared to operating DC-DC converters off clock signal pairs that are distributed over only a portion of the clock cycle time. The circuit 1100 includes two NAND gates 1110, 1120, delay elements 1130, and inverters 1140 to generate the two-phase, non-overlapping clock signal pairs. In this case, anti-phase operation results in a 180 degree phase shift of the additional clocks, and the additional clocks do not coincide with any of the original clocks. For example, the first inverter 1140 in the first delay path provides both CLK1A and CLK9B. As a result, the circuit 1100 may provide double the number of clock signals (or occupy a smaller area for the same number of clock signals) as compared to the approach of FIG. 8.

System

Figure 12:
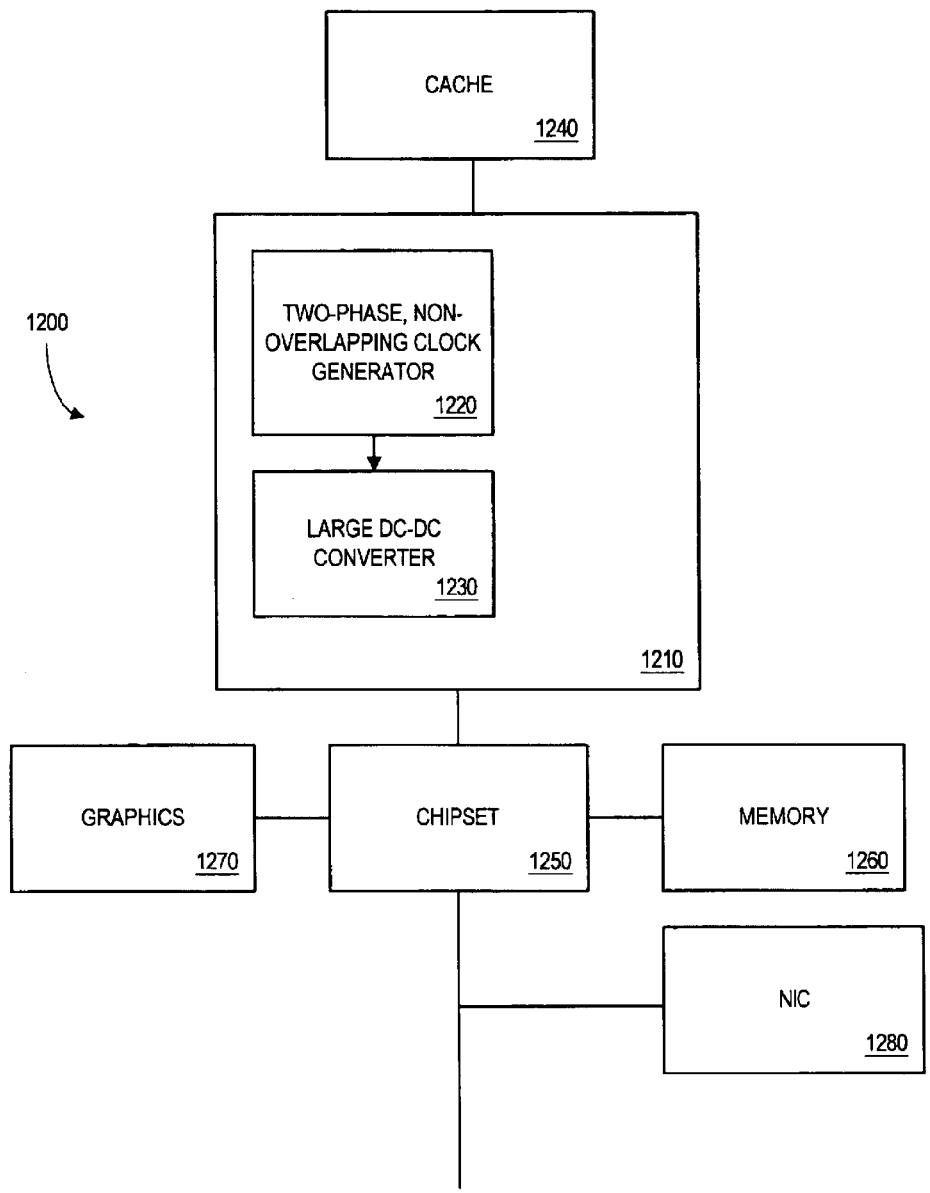
FIG. 12 is a system including an integrated circuit according to some embodiments.

FIG. 12 is a system 1200 including an integrated circuit 1210 with a two-phase, non-overlapping clock generator 1220 according to some embodiments. The integrated circuit 1210 may be a microprocessor or another type of integrated circuit. According to some embodiments, the integrated circuit 1210 also communicates with an off-die cache 1240. The integrated circuit 1210 may also communicate with a system memory 1260 via a host bus and a chipset 1250. In addition, other off-die functional units, such as a graphics accelerator 1270 and a Network Interface Controller (NIC) 1280 may communicate with the integrated circuit 1210 via appropriate busses.

The two-phase, non-overlapping clock generator 1220 may be associated with any of the embodiments described herein (e.g., including the circuits described with respect to FIG. 3, 8, 9, or 11). According to some embodiments, clock signals generated by the two-phase, non-overlapping clock generator 1220 are provided to a large DC-DC converter 1230 (e.g., a large simple DC-DC converter or a large distributed DC-DC converter).

Additional Embodiments

The following illustrates various additional embodiments. These do not constitute a definition of all possible embodiments, and those skilled in the art will understand that many other embodiments are possible. Further, although the following embodiments are briefly described for clarity, those skilled in the art will understand how to make any changes, if necessary, to the above description to accommodate these and other embodiments and applications.

For example, complementary signals and/or logic may be used for various embodiments, well-known circuit elements and/or signals may be implemented to or provided in a variety of different ways, and/or a variety of different host integrated circuits may implement such designs. Similarly, embodiments have been described herein with respect to NAND implementations of clock generator circuits. Those skilled in the art will note that by replacing a NAND gate by an equivalent circuit using a NOR gate, NOR implementations may be provided instead. In addition, a NAND gate might be replaced by an AND gate followed by an inverter.

The several embodiments described herein are solely for the purpose of illustration. Persons skilled in the art will recognize from this description other embodiments may be practiced with modifications and alterations limited only by the claims.

What is claimed is:

1. An apparatus, comprising:
   a first NAND gate having two input lines and an output line;
   a first delay path coupled between the output line of the first NAND gate and one of the input lines of the first NAND gate;
   a second NAND gate having two input lines and an output line; and
   a second delay path coupled between the output line of the second NAND gate and one of the input lines of the second NAND gate,
   wherein (i) a first node associated with the first delay path is directly coupled to the other input line of the second NAND gate and a second node associated with the second delay path is directly coupled to the other input line of the first NAND gate and (ii) the first delay path further includes a delay portion between the output of the first NAND gate and the first node and the second delay path includes a delay portion between the output of the second NAND gate and the second node.

2. The apparatus of claim 1, wherein the first node is associated with a first clock signal and the second node is associated with a second clock signal.

3. The apparatus of claim 2, wherein the first and second clock signals comprise two-phase, non-overlapping clock signals.

4. The apparatus of claim 3, wherein the first delay path includes a delay portion between the first node and the input of the first NAND gate and the second delay path includes a delay portion between the second node and the input of the second NAND gate.

5. The apparatus of claim 2, wherein the first and second clock signals are to be provided to at least one of: (i) a series of latches, and (ii) a simple DC-DC converter.

6. The apparatus of claim 1, wherein T2A is greater than T1B and T2B is greater than T1A so as to define active and dead times associated with two clock phases, where T1A represents an amount of time a signal takes to propagate from an input of the first NAND gate to the first node, T2A represents an amount of time a signal takes to propagate from the first node to an input of the first NAND gate, T1B represents an amount of time a signal takes to propagate from an input of the second NAND gate to the second node, and T2B represents an amount of time a signal takes to propagate from the second node to an input of the second NAND gate.

7. The apparatus of claim 1, wherein each delay path includes a plurality of delay elements.

8. The apparatus of claim 7, wherein at least one delay element is associated with at least one of: (i) an even number of CMOS inverters, (ii) an analog current-starved inverter, and (iii) a digital current-starved inverter.

9. The apparatus of claim 7, wherein a plurality of clock signal pairs are provided from a plurality of nodes associated with the delay elements.

10. The apparatus of claim 9, wherein the clock signal pairs comprise multiple two-phase, non-overlapping clock signal pairs.

11. The apparatus of claim 10, wherein the clock signal pairs are to be provided to a large distributed DC-DC converter.

12. The apparatus of claim 1, wherein a mismatch is provided between a delay associated with the first delay path and a delay associated with the second delay path.

13. A method, comprising:
   providing a signal associated with a first node in a first delay path to an input line of a second NAND gate; and
   providing a signal associated with a second node in a second delay path to an input line of a first NAND gate,
   wherein (i) the first delay path is coupled between an output line of the first NAND gate and another input line of the first NAND gate and the second delay path is coupled between an output line of the second NAND gate and another input line of the second NAND gate and (ii) the first delay path further includes a delay portion between the output of the first NAND gate and the first node and the second delay path includes a delay portion between the output of the second NAND gate and the second node.

14. The method of claim 13, wherein the first node is associated with a first clock signal and the second node is associated with a second clock signal.

15. A system, comprising:
   a chipset; and
   a die comprising a microprocessor in communication with the chipset, wherein the microprocessor includes a clock generation circuit comprising:
   a first NAND gate having two input lines and an output line;
   a first delay path coupled between the output line of the first NAND gate and one of the input lines of the first NAND gate;
   a second NAND gate having two input lines and an output line; and
   a second delay path coupled between the output line of the second NAND gate and one of the input lines of the second NAND gate,
   wherein (i) a first node associated with the first delay path is directly coupled to the other input line of the second NAND gate and a second node associated with the second delay path is directly coupled to the other input line of the first NAND gate and (ii) the first delay path further includes a delay portion between the output of the first NAND gate and the first node and the second delay path includes a delay portion between the output of the second NAND gate and the second node.

16. The system of claim 15, wherein the first node is associated with a first clock signal and the second node is associated with a second clock signal.

17. The system of claim 16, wherein the first and second clock signals are to be provided to at least one of: (i) a series of latches, and (ii) a simple DC-DC converter.

18. An apparatus, comprising:
   a first NAND gate having two input lines and an output line;
   a first delay path coupled between the output line of the first NAND gate and one of the input lines of the first NAND gate, the first delay path comprising:
      a first delay element between the output of line of the first NAND gate and a first node, and
      a second delay element between the first node and the input line of the first NAND gate;
   a second NAND gate having two input lines and an output line;
   a second delay path coupled between the output line of the second NAND gate and one of the input lines of the second NAND gate, the second path comprising:
      a third delay element between the output of line of the second NAND gate and a second node, and
      a fourth delay element between the second node and the input line of the second NAND gate;
   a first output from the first node associated with a first clock signal; and
   a second output from the second node associated a second clock signal, the first and second clock signals being two-phase, non-overlapping clock signals,
   wherein (i) the first node is directly coupled to the other input line of the second NAND gate, (ii) the second node is directly coupled to the other input line of the first NAND gate, and (iii) no externally generated clock signal is received by the apparatus.

* * * * *